(12) United States Patent
Ouellet

(10) Patent No.: US 6,635,509 B1
(45) Date of Patent: Oct. 21, 2003

(54) WAFER-LEVEL MEMS PACKAGING

(75) Inventor: Luc Ouellet, Granby (CA)

(73) Assignee: Dalsa Semiconductor Inc., Bromont (CA)

( * ) Notice: Subject to any disclaimer, the term of this patent is extended or adjusted under 35 U.S.C. 154(b) by 0 days.

(21) Appl. No.: 10/120,528

(22) Filed: Apr. 12, 2002

(51) Int. Cl.[7] .................. H01L 21/44; H01L 21/48; H01L 21/50
(52) U.S. Cl. .................. 438/106; 438/50; 438/108
(58) Field of Search .................. 438/108, 113, 438/33, 50, 52, 53, 456, 458, 106, 107

(56) References Cited

U.S. PATENT DOCUMENTS

| | | | |
|---|---|---|---|
| 5,589,082 A | 12/1996 | Lin et al. .................. | 216/2 |
| 5,668,033 A | 9/1997 | Ohara et al. .................. | 438/113 |
| 5,783,749 A | 7/1998 | Lee et al. .................. | 73/504.12 |
| 5,937,275 A | 8/1999 | Munzel et al. .................. | 438/50 |
| 5,952,572 A | 9/1999 | Yamashita et al. .................. | 73/504.04 |
| 6,140,144 A | 10/2000 | Najafi et al. .................. | 438/53 |
| 6,232,150 B1 | 5/2001 | Lin et al. .................. | 438/119 |
| 6,265,246 B1 | 7/2001 | Ruby et al. .................. | 438/113 |
| 6,297,072 B1 | 10/2001 | Tilmans et al. .................. | 438/106 |
| 6,335,224 B1 | 1/2002 | Peterson et al. .................. | 438/114 |

OTHER PUBLICATIONS

1) "A comparison between wet HF etching and vapor HF etching for sacrificial oxide removal", A. Witvrouw et al., pp. 130–141.
2) "Micromachining and microfabrication process technology V1", Jean–Michel Karam et al., The International Society for Optical Engineering, vol. 4174.
3) "Micromachining and microfabrication process technology III", Shih–Chia Chang et al., The International Society for Optical Engineering, vol. 3223.

Primary Examiner—Richard Elms
Assistant Examiner—Beth E. Owens
(74) Attorney, Agent, or Firm—Marks & Clerk

(57) ABSTRACT

A competitive, simple, single-substrate wafer-level packaging technique capable of creating a vacuum-sealed protective cavity around moving or other particular components of a MEMS is described. The technique uses common semiconductor materials, processing steps and equipment to provide a stable vacuum environment of, for example less than 1 Pa, in a sealed cavity. The environment protects components of the MEMS against micro-contamination from particles and slurry of a waver dicing process and against fluctuations of atmospheric condition to ensure long term reliability.

17 Claims, 19 Drawing Sheets

An integrated process for single-substrate, wafer-level protective cap

Removal of the Structural ISDP surrounding the aluminum interconnects and bond pads outside the vacuum-sealed protection cavity

Figure 1
Packaging of a micro-mechanical resonators
using a 3.0 μm thick LPCVD low-stress silicon nitride micro-shell
(USA patent 5,589,082)
(The Regents of the University of California)

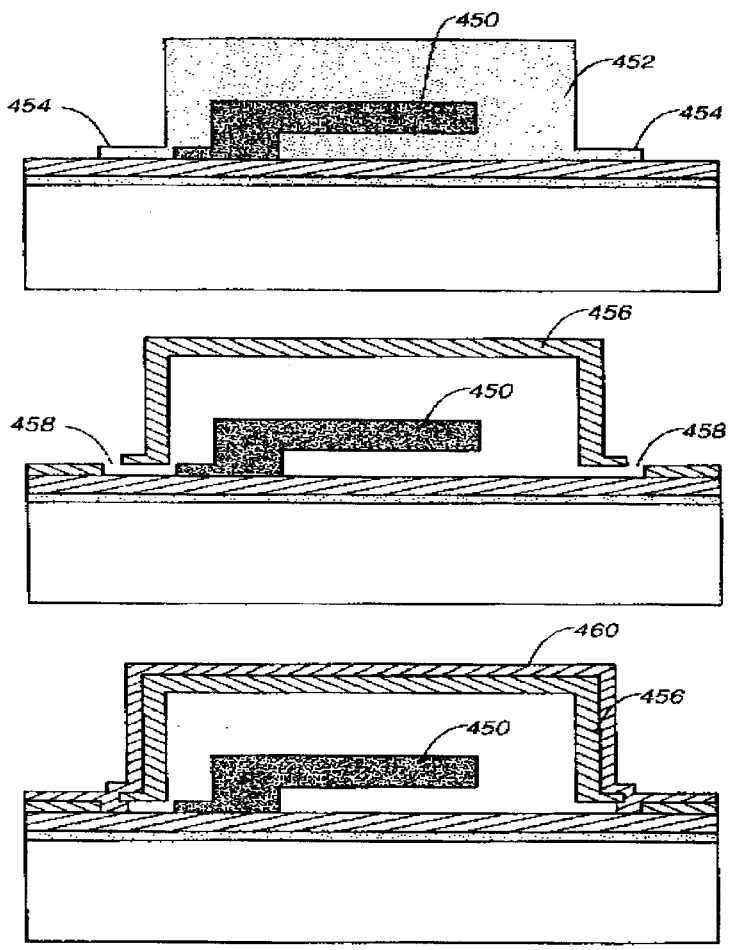

450 : Micro-mechanical resonator
452 : A 7.0 μm thick LPCVD PSG covered by a 1.0 μm thick PSG
454 : A 1.0 μm thick PSG where narrow channels will be formed following its removal
456 : A 1.0 μm thick LPCVD low-stress silicon nitride
458 : Narrow channels after removal following the removal of the 1.0 μm thick PSG
460 : A 2.0 μm thick LPCVD low-stress silicon nitride

PRIOR ART

Figure 2
Packaging of an acceleration sensor device
via gold-silicon (SOI wafer) or gold-polysilicon eutectic bonding
(USA patent 5,668,033)
(Nippon Denso Co., Ltd.)

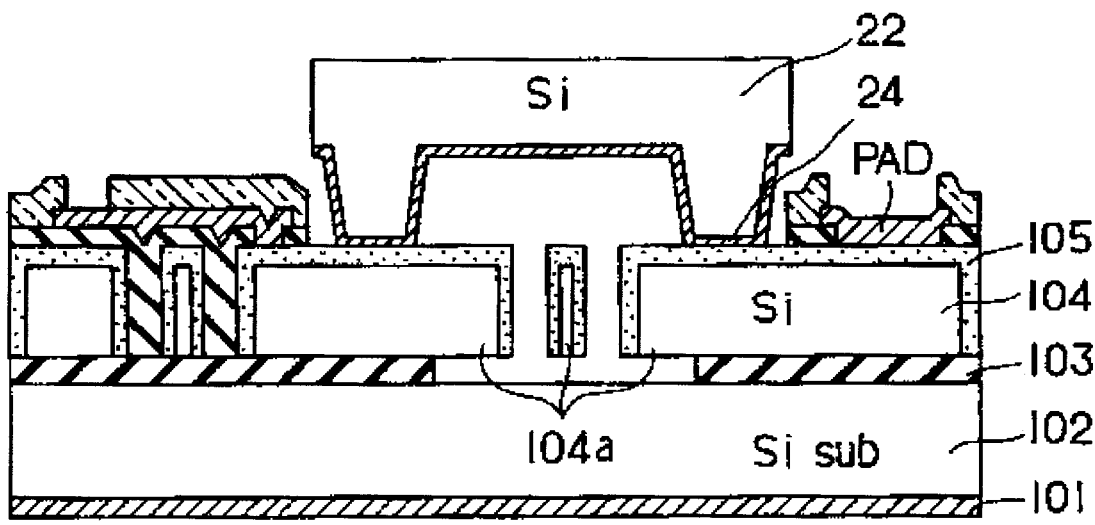

- 22 : Protection cap
- 24 : Gold for eutectic bonding to silicon (SOI wafer) or polysilicon
- 101 : Back-side electrode
- 102 : Silicon (SOI wafer) or polysilicon
- 103 : Oxide film
- 104 : Silicon substrate (SOI wafer) or polysilicon
- 104a : The beams (one of them is shown free to move)
- 105 : Surface doping of the silicon (SOI wafer) or polysilicon

PRIOR ART

Figure 3
Vacuum packaging of a micro-gyroscope
using a sealed packaging structure
(USA patent 5,783,749)
(Electronics and Telecommunications Research Institute)

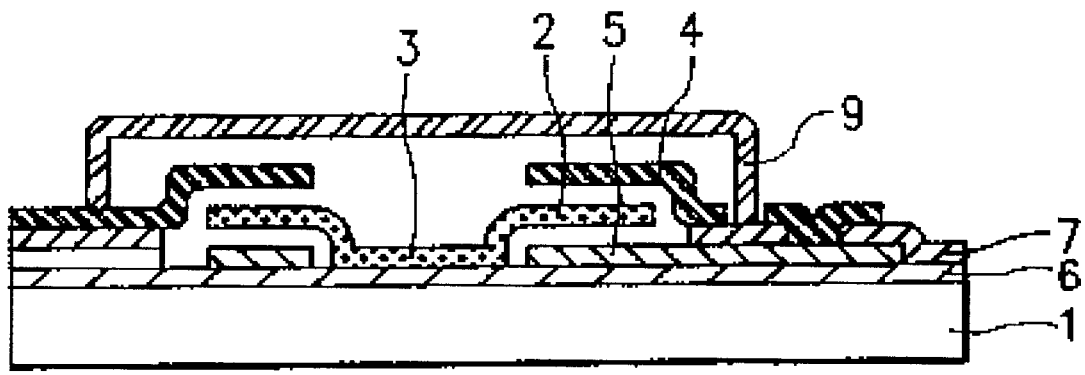

1 : Silicon wafer
2 : Vibrating disk
3 : Support platform
4 : Drive electrode
5 : Detection electrode
6 : Insulating layer
7 : Upper sacrificial layer
9 : Sealed packaging structure covering the gyroscope as to maintain a 1mTorr pressure to enhance sensitivity and to minimise air damping

PRIOR ART

Figure 4
Vacuum packaging of an angular rate sensor
using anodic bonding
(USA patent 5,952,572)
(Matsushita Electric Industrial Co., Ltd.)

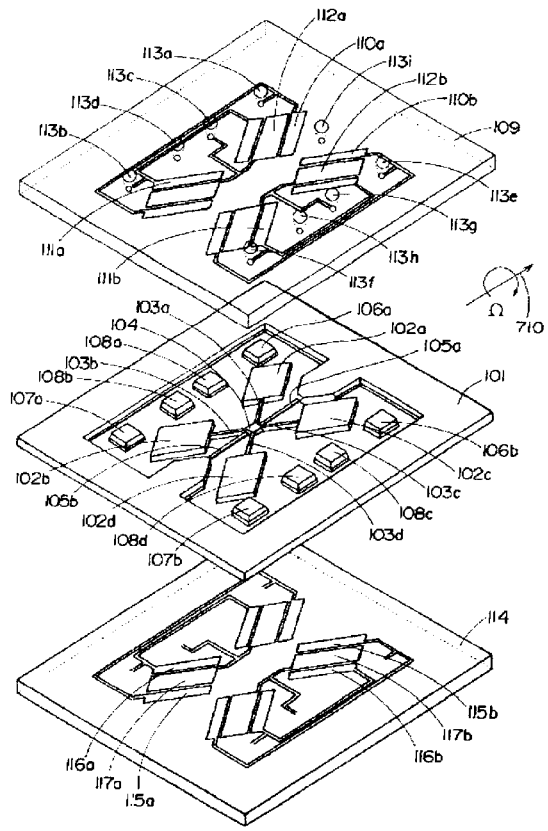

| Description of the Reference Numerals | |
|---|---|
| 101, 301, 602, 1101, 1201 | Silicon substrate |
| 109, 401, 601 | Upper glass |
| 114, 501, 604 | Lower glass |
| 102a, 102b, 102c, 102d, 316, 701, 901, 1001, 1004, 1213 | Mass |
| 702, 103a, 103b, 103c, 103d, 317, 902, 1005, 1212 | Cantilever beam |
| 104 | Coupling portion |
| 105a, 105b, 318b, 1002, 1211 | Bridge |
| 1104c, 106a, 106b, 107a, 107b, 108a, 108b, 108c, 108d, 1104a, 1104b, 1104d, 1104e, 1104f | Feedthrough island |
| 110a, 110b, 115a, 115b, 703, 903 | Driving electrode |
| 111a, 11b, 116a, 116b, 705, 905 | Monitoring electrode |
| 112a, 112b, 117a, 117b, 704, 904 | Detection/control electrode |
| 113f, 113a, 113b, 113c, 113d, 113e, 113g, 113h, 113i, 402 | Glass through hole |
| 1103d, 1007, 1103a, 1103b, 1103c, 1103e, 1103f | Silicon through hole |
| 1003, 1006, 1102a, 1102b, 1214 | diffused resistor layer |
| 607 | Wiring |
| 1401, 1402 | Detecting element |
| 1403, 1404 | Oscillating element |

PRIOR ART

Packaging of a micro-sensor
via flip chip bonding using an underfill material
(USA patent 6,140,144)
(Integrated Sensing Systems, Inc.)

1 : Sensor chip
2 : Substrate
4 : Sensing element
6 : Pad
8 : Metal lines
12 : Wire bonding
14 : Underfill material
21 : Controlled environment cavity
22 : Bonded cap bonded to the substrate, 2, using underfill material

PRIOR ART

Packaging of a microstructure
via flip chip bonding using a bonding material and a metal-based localised micro-
heater as to locally heat the bonding material
(USA patent 6,232,150)
(The Regents of the University of Michigan)

PRIOR ART

Figure 7

Packaging of a micro-device using cold welding of a matching cap wafer having bonding cap gaskets located at the periphery of the bonding pads of the micro-device
(USA patent 6,265,246)
(Agilent Technologies, Inc.)

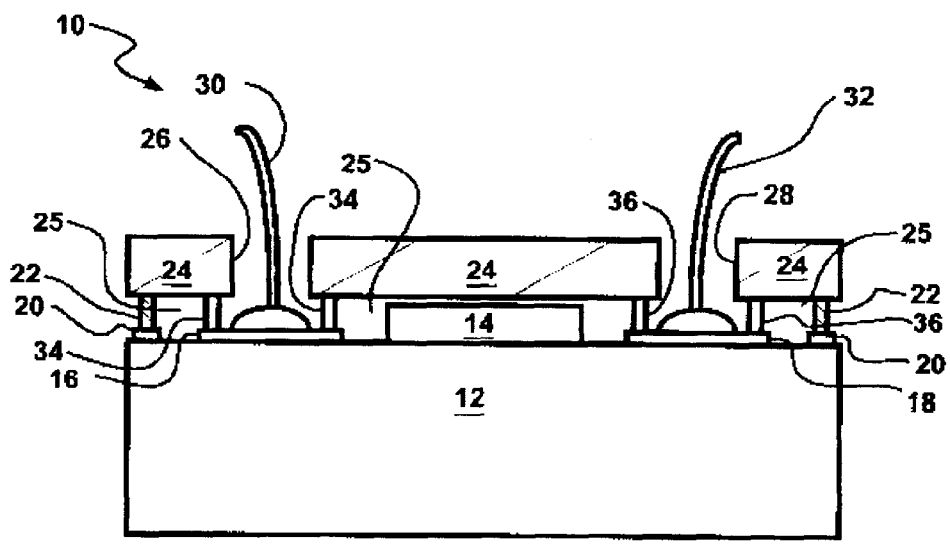

10 : Microcap wafer-level package
12 : Base wafer
14 : Micro-device
16 : Bonding pad
18 : Bonding pad
20 : Peripheral pad
22 : Peripheral gasket
24 : Cap wafer
25 : Hermetically sealed volume
26 : Through hole
28 : Through hole
30 : Bonding wire
32 : Bonding wire
34 : Bonding pad gasket
36 : Bonding pad gasket

PRIOR ART

Figure 8
Formation of a microstructure having an internal cavity
(USA patent 6,297,072)
(Interuniversitair Micro-Electronika Centrum, IMEC, VZW)

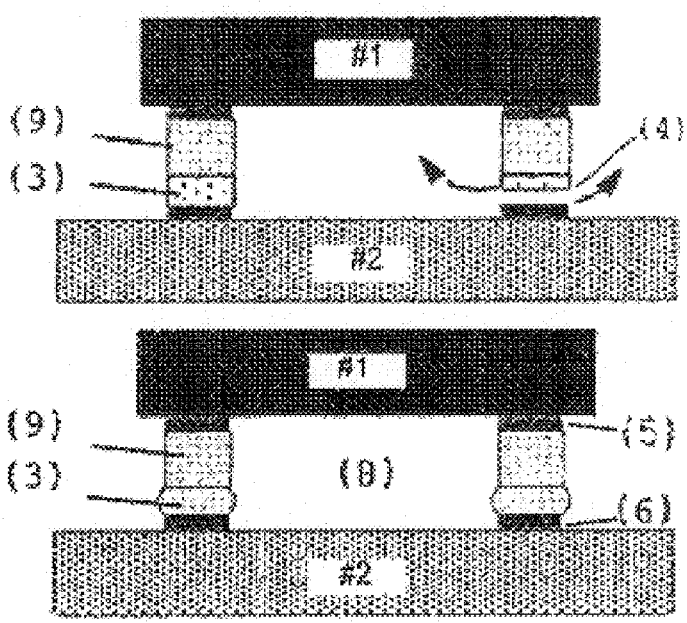

1 : First chip
2 : Second chip
3 : Antimony-lead, antimony-lead-silver, indium, gold-antimony, anytimony-silver, antimony-silver-copper or antimony-bismuth electroplated solder ring capable of being reflowed at 200-350°C
4 : Evacuation indent or groove which disappears by surface tension during the reflow of the solder ring
5 : Antimony-copper or antimony-nickel/gold metallisation sead layer forming a stable intermetallic compound with the selected solder
6 : Antimony-copper or antimony-nickel/gold metallisation sead layer forming a stable intermetallic compound with the selected solder
8 : Vacuum or controlled ambient cavity
9 : Spacer

PRIOR ART

Figure 9
Protection of a released MEMS element during packaging
(USA patent 6,335,224)
(Sandia Corporation)

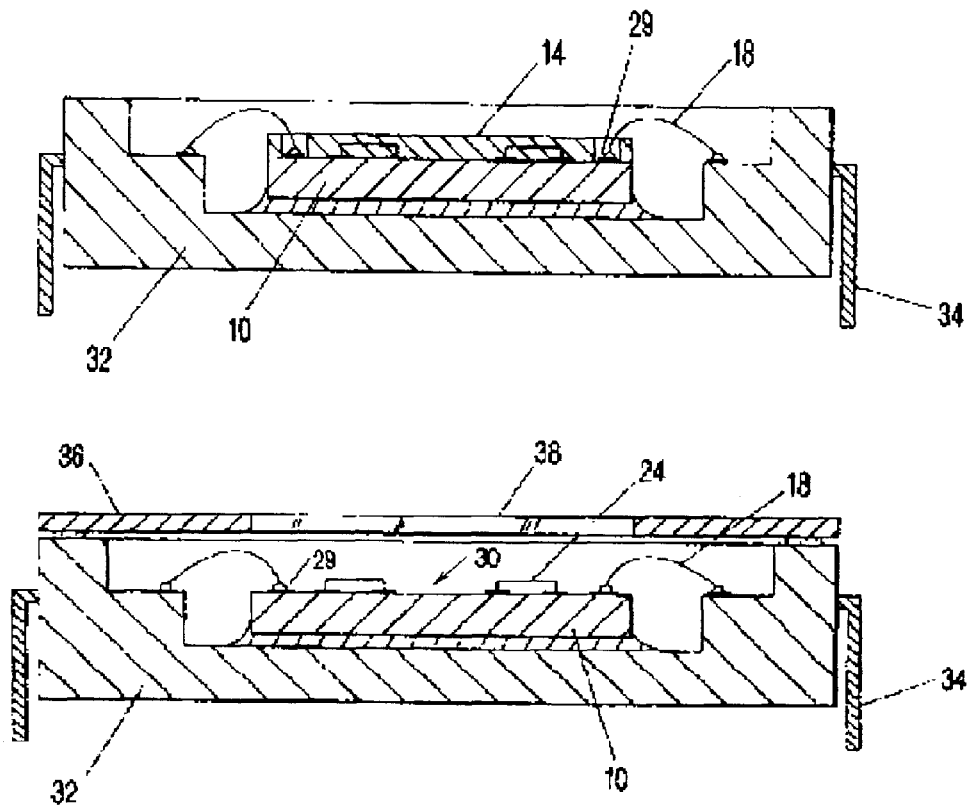

10 : MEMS or device substrate bonded to the package
14 : Water-insoluble vacuum vapor deposited conformal and dry-etchable temporary protection coating such as parylene, protecting against micro-contamination from dicing and removed at the packaging step using an oxygen plasma
18 : Bond wires
24 : Released MEMS element to be protected
29 : Bond pads
30 : MEMS or IMEMS device die
32 : Package
34 : External electrical leads
36 : Cover lid
38 : Optical window

PRIOR ART

Method of producing acceleration sensors
(USA patent 5,937,275)
(Robert Bosch GmbH)

1 : Substrate
2 : Sacrificial layer
3 : Polysilicon starter layer
4 : Silicon layer
5 : Monocrystalline silicon layer
6 : Polycrystalline silicon
9 : Photoresist layer
10 : Masking layer

PRIOR ART

Robert Bosch surface micromachining profile
(http://www.europractice.bosch.com/en/foundry/)

| | | |
|---|---|---|
| S1: | Wafer thickness : | 675 ± 15 µm |
| S2: | Pad oxide layer thickness : | 2.5 ± 0.15 µm |
| S3: | Surface polysilicon layer thickness : | 0.45 ± 0.05 µm |
| S4: | Sacrificial oxide layer thickness : | 1.6 ± 0.2 µm |
| S5: | Structural ISDP layer thickness : | 10.3 ± 1.0 µm |
| S6: | Metal layer thickness : | 1.3 ± 0.2 µm |
| S7: | Cap wafer thickness : | 380 ± 15 µm |
| S8: | Cavity height : | 75 ± 25 µm |

PRIOR ART

Cap wafer glass frit bonded to the surface micromachined
gyroscope produced at Robert Bosch GmbH.
(http://www.imec.be/SUMICAP/Welcome.html)

Gyroscope

Cap wafer (opened for demonstration)

Glass frit bonding

PRIOR ART

A typical surface micromachining process flow
up to the release of the Structural polysilicon components

PRIOR ART

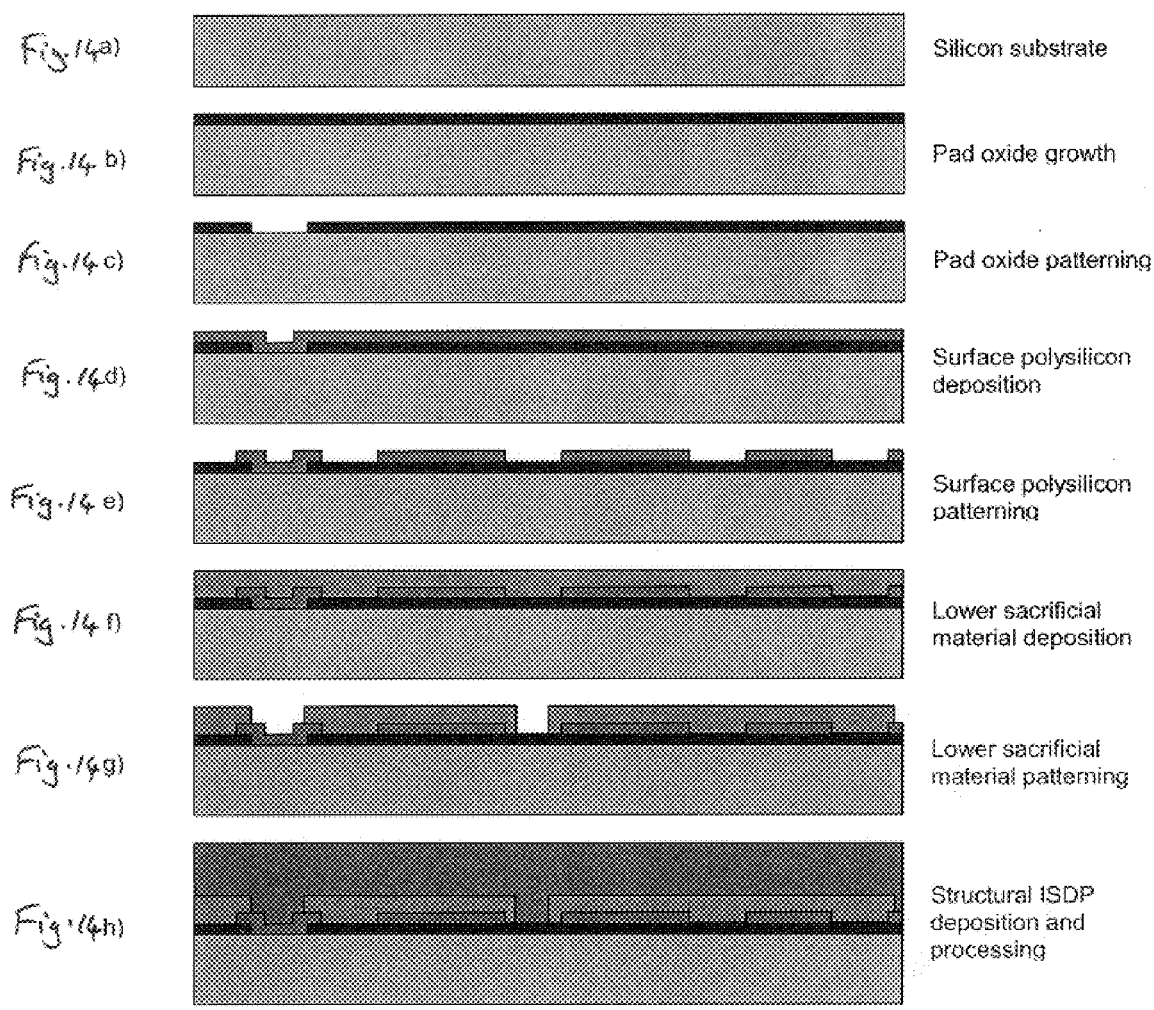

An integrated process for single-substrate, wafer-level protective cap

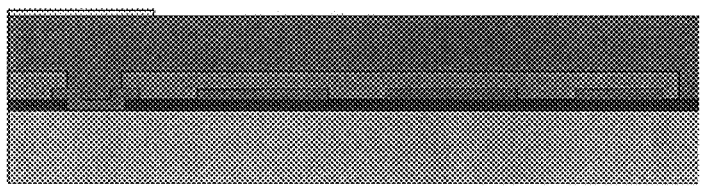

Fig. 14 i) Deposition and patterning of a film resistant to HF vapor outside the projected protection cavity

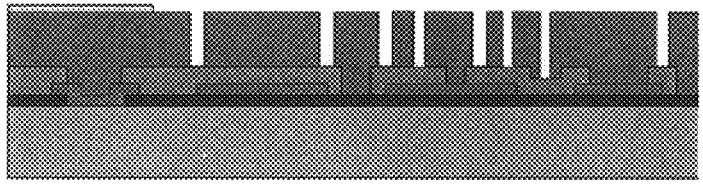

Fig. 14 j) Photolithography and deep-etch of the Structural ISDP

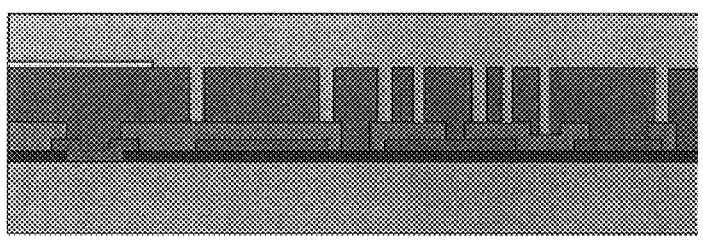

Fig. 14 k) Deposition of an Upper sacrificial material

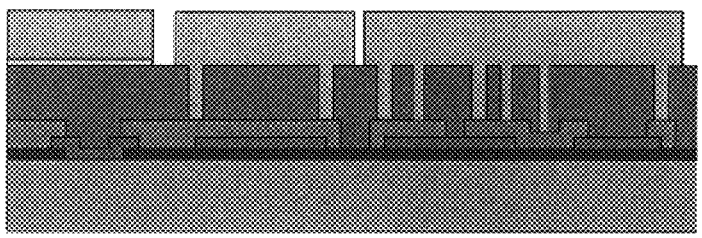

Fig. 14 l) Patterning of the Upper sacrificial material

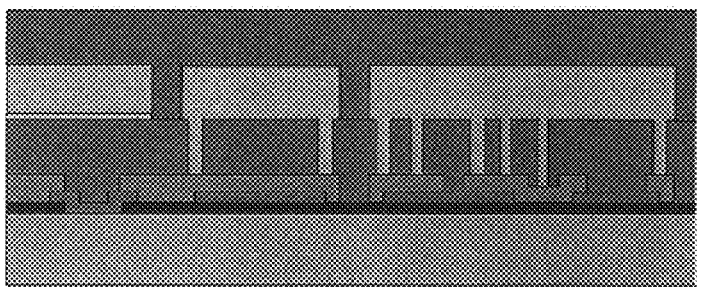

Fig. 14 m) Deposition of the Enapsulation structure

An integrated process for single-substrate, wafer-level protective cap

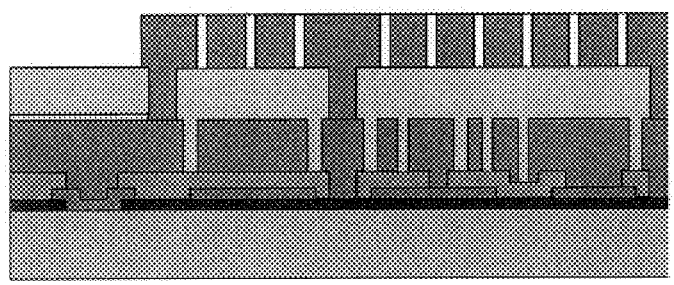

Fig. 14 n)

Patterning of the Encapsulation structure

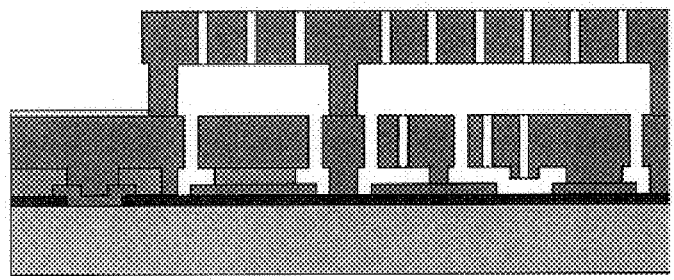

Fig. 14 o)

Removal of the Upper sacrificial material and of the Lower sacrificial material thus releasing the MEMS inside an enclosed cavity ready to be vacuum sealed

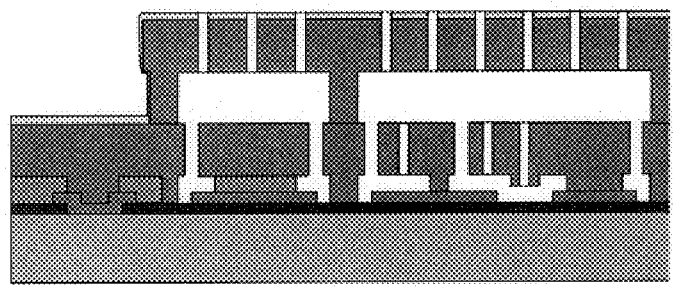

Fig. 14 p)

Optional deposition of a titanium-based layer to be used as an integrated getter of undesirable gases to accumulate in the cavity over the life of the device An integrated process for single-substrate, wafer-level protective cap

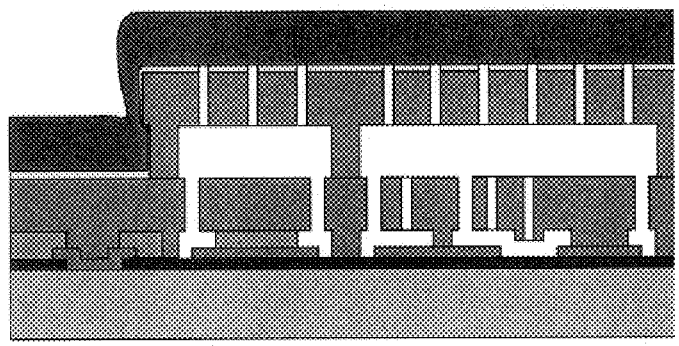

Fig. 14 q)

Deposition and self-diffusion of a thick aluminum alloys to vacuum seal the underlying cavity. An optional layer or combination layer can be added to enhance the rigidity of the structure (NOT SHOWN)

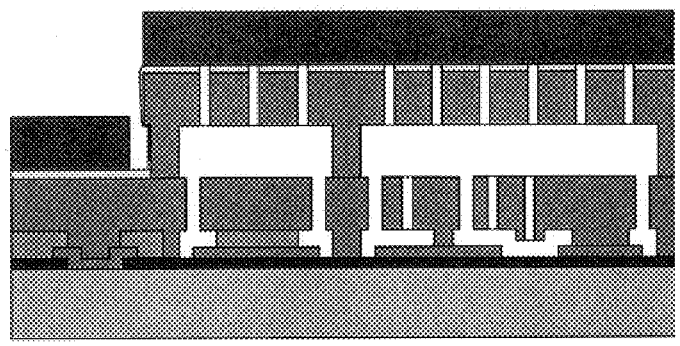

Fig. 14 r)

Patterning of the aluminum interconnects and bond pads outside th protective cavity

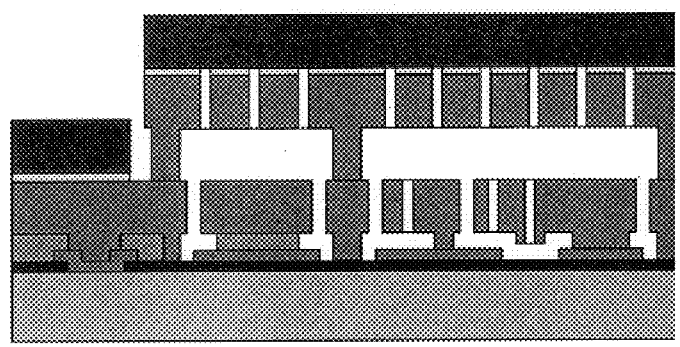

Fig. 14 s)

Removal of the TiN surrounding the aluminum interconnects and the bond pads outside the cavity An integrated process for single-substrate, wafer-level protective cap Removal of the Structural ISDP surrounding the aluminum interconnects and bond pads outside the vacuum-sealed protection cavity Amplitude of the vertical movement of the
Encapsulation structure estimation using the Bulge testing model $$P(w_0) = c_1 \frac{\sigma_0 h}{a^2} w_0 + c_3(v) \frac{Eh}{a^4(1-v)} w_0^3,$$

For square structures : $c1 = 13.64$; $c3(v) = 31.70 - 9.360\,v$

| Material | Young's Modulus (E) | Poisson's Coefficient ($v$) | Mass Density |
|---|---|---|---|
| PECVD SiN (0% LF) | 86 GPa | | 1.84 g/cc |
| PECVD SiN (44% LF) | 130 GPa | | 2.52 g/cc |
| PECVD SiN (60% LF) | 140 Gpa | 0.254 | |
| LPCVD SiN | | 0.28 | |
| Ti | 168 GPa | 0.25 | |
| Au | 74.4 GPa | | 0.42 |

WAFER-LEVEL MEMS PACKAGING

FIELD OF THE INVENTION

This invention relates to Micro-Electro-Mechanical-Systems (MEMS) and more particularly to a wafer level MEMS packaging technique which prevents processing related micro-contamination.

BACKGROUND

The manufacturing of Micro-Electro-Mechanical-Systems (MEMS) such as micro-gyroscopes, micro-accelerometers, resonant accelerometers, micro-mirrors, micro-motors, micro-actuators and other such micro-devices, for automotive, photonics, information technology and bio-mechanical markets, integrating at least one moving and/or particular component causes a very serious challenge for packaging because:

Some MEMS-based devices require the encapsulation to be done before dicing, as to be protected against micro-contamination from particles and dicing slurry while being processed like a standard semiconductor chip, without the need for dedicated equipment or processes for dicing, mounting and molding procedures inside the cleanrooms.

Changes in atmospheric conditions can change the capacitance readout of micro-gyroscopes and micro-accelerometers without any changes in acceleration and because an increased relative humidity can increase stiction of their moving parts, it is necessary to encapsulate their moving and/or particular components in vacuum or in a controlled atmosphere.

Most MEMS-based resonant accelerometers, most MEMS-based RF switching devices and other such MEMS devices have very serious Q-factor degradation when exposed to an ambient pressure exceeding 1 Pa. Their moving MEMS components require a vacuum packaging to a residual pressure of less then 1 Pa as to ensure a reliable service during its complete projected life.

To ensure these functions, the moving and/or particular component should be enclosed in a sealed micro-cavity under a vacuum of less then 1 Pa.

PRIOR ART

A first example of protective packaging is provided in FIG. 1 taken from the following cited Prior Art reference:
U.S. Pat. No. 5,589,082 titled 'Microelectromechanical signal processor to fabrication' (The Regents of the University of California).

The micro-cavity described in U.S. Pat. No. 5,589,082 is used to protect a micro-mechanical resonator and is formed using a vacuum sealed silicon nitride micro-shell fabricated by:

Properly micromachining the micro-mechanical resonator to a certain fabrication step;

Depositing a 7.0 $\mu$m thick phosphosilicate (PSG) layer over the micromachined micro-mechanical resonator;

Patterning the 7.0 $\mu$m thick PSG layer into an isolated island covering the moving and/or particular component of the micromachined micro-mechanical resonator and defining the shape of the micro-shell;

Depositing an extra 1.0 $\mu$m thick PSG layer;

Patterning the lateral etch-channels at the periphery of the isolated island of FIG. 1;

Depositing an extra 1.0 $\mu$m thick LPCVD low-stress silicon nitride;

Patterning the lateral etch holes in the silicon nitride located at the periphery of the isolated island;

Release of the micro-mechanical resonator using concentrated HF penetration through the lateral etch holes formed at the periphery of the isolated island of all sacrificial material located under and over (7.0 $\mu$m thick PSG layer) the moving and/or particular component of the micromachined micro-mechanical resonator, leaving the formed 1.0 $\mu$m thick LPCVD low-stress silicon nitride micro-shell intact;

Sealing of the lateral etch holes formed at the periphery of the formed micro-shell using a 2.0 $\mu$m thick layer of silicon nitride deposited over the suspended 1.0 $\mu$m thick LPCVD low-stress silicon nitride micro-shell, as to form a 3.0 $\mu$m thick LPCVD low-stress silicon nitride micro-shell.

As indicated in the patent at column 11, lines 7–12, the release of the micro-mechanical resonator using concentrated HF through the lateral etch holes formed at the periphery of the silicon micro-shell limits the size of the micro-device to about 500 $\mu$m×500 $\mu$m due to:

Incomplete sacrificial material removal away from the periphery of the micro-shell;

Collapse of the 3.0 $\mu$m thick LPCVD low-stress silicon nitride micro-shell upon exposure to atmospheric pressure.

A second example of protective packaging is provided in FIG. 2 taken from the following cited Prior Art reference:
U.S. Pat. No. 5,668,033 titled 'Method for manufacturing a semiconductor acceleration sensor device'.

The packaging technique of U.S. Pat. No. 5,668,033, used to fabricate the packaging structure covering the acceleration sensor uses gold-silicon (case where a silicon-on-insulator substrate is used) or gold-polysilicon eutectic bonding technique.

This technique requires the bonding of two substrates.

A third example of protective packaging is provided in FIG. 3 taken from the following cited Prior Art reference:
U.S. Pat. No. 5,783,749 titled 'Vibrating disk type micro-gyroscope' (Electronics and telecommunications research Institute).

The packaging technique of U.S. Pat. No. 5,783,749, used to fabricate the vacuum sealed packaging structure covering the gyroscope as to maintain a 1 mTorr pressure to enhance its sensitivity and to minimise air damping, uses an unknown bonding technique.

This technique also requires the bonding of two elements, i.e. of a sealed structure and of a substrate, as indicated in column 3D, lines 25–31.

A fourth example of protective packaging is provided in FIG. 4 taken from the following cited Prior Art reference:
U.S. Pat. No. 5,952,572 titled 'Angular rate sensor and acceleration sensor' (Matsushita Electric Industrial Co., Ltd.).

The three substrates composing the angular rate sensor described in U.S. Pat. No. 5,952,572 are bonded together as a sandwich structure using anodic bonding, as mentioned in column 7, lines 36–41. This anodic bonding requires the silicon and glass substrates to be heated at 300–400° C. in vacuum while a negative voltage of about 1000V in terms of reference potential of the silicon substrate is applied to the glass substrates. As mentioned in column 7, lines 55–58, a Zr—V—Fe/Ti non-volatile getter material is also integrated in the sealed cavity as to maintain the vacuum quality.

This technique also requires the bonding of two substrates.

A fifth example of such protective packaging is provided in FIG. 5 taken from the following cited Prior Art reference which also review the Prior Art in microsensor's packaging, as of April of 1997:

U.S. Pat. No. 6,140,144 titled 'Method for packaging microsensors' (Integrating Sensing Systems, Inc.).

The two substrates composing the microsensors described in U.S. Pat. No. 6,140,144 are bonded together via flip chip bonding using an underfill material as to maintain a controlled pressure/controlled environment around the sensing element, as mentioned in column 3, lines 48–50.

This technique also requires the bonding of two substrates.

A sixth example of such protective packaging is provided in FIG. 6 taken from the following cited Prior Art reference:

U.S. Pat. No. 6,232,150 titled 'Process for making microstructures and microstructures made thereby' (The Regents of the University of Michigan).

The two substrates composing the microstructures described in U.S. Pat. No. 6,232,150 are bonded together using a localised micro-heater flip chip bonding using a bonding material and a metal-based localised resistive micro-heater capable of locally heating the bonding material as to provoke the bonding of the two substrates, as mentioned in column 4, lines 25–35.

This technique also requires the bonding of two substrates.

A seventh example of such protective packaging is provided in FIG. 7 taken from the following cited Prior Art reference;

U.S. Pat. No. 6,265,246 titled 'Microcap wafer-level package' (Agilent Technologies, Inc.).

The base wafer integrating a micro-device described in U.S. Pat. No. 6,265,246 is bonded to a matching cap wafer using cold welding of the bonding pad gaskets of the cap wafer to the periphery of the bonding pads of the base wafer integrating the micro-device. The arrangement assures an hermetic seal of the wafer-level package and electrical connections to the micro-device without passing through a seal.

This technique also requires the bonding of two substrates.

An eighth example of such protective packaging is provided in FIG. 8 taken from the following cited Prior Art reference:

U.S. Pat. No. 6,297,072 titled 'Formation of a microstructure having an internal cavity' (Interuniversitair Micro-Electronika Centrum, IMEC, VZW).

A first chip located on first substrate covered with antimony-copper or antimony-nickel/gold metallization seed layer forming a stable intermetallic compound with a selected solder is bonded to a second chip located on a second substrate also covered with antimony-copper or antimony-nickel/gold metallization seed layer via an antimony-lead, an antimony-lead-silver, an indium, a gold-antimony, an antimony-silver, an antimony-silver-copper or an antimony-bismuth electroplated solder ring capable of being reflowed at 200–350° C. as to create an enclosed vacuum or controlled ambient cavity.

This technique also requires the bonding of two substrates.

An ninth example of such protective packaging is provided in FIG. 9 taken from the following cited Prior Art reference:

U.S. Pat. No. 6,335,224 titled 'Protection of microelectronic devices during packaging' (Sandia Corporation).

A released MEMS element is protected by a water-insoluble vacuum vapor deposited conformal and dry-etchable temporary protective coating such as parylene during dicing allowing its protection against microcontamination. This protective coating is later removed using an oxygen plasma when the diced MEMS or IMEMS device substrate is bonded to the package and when the bond pads of the MEMS device are electrically connected to the external electrical leads with bond wires. Following the removal of the protective coating, a cover lid including an optional optical window is bonded to the package protecting the released MEMS element.

This technique requires a temporary protective coating to be removed using an oxygen plasma during die packaging, just prior to cover lid bonding.

Robert Bosch GmbH is probably one of the leading groups in surface micromachining. The Prior Art description will try to cover the work performed by this group in the development of MEMS packaging:

FIG. 10 is taken from the following cited Prior Art reference:

U.S. Pat. No. 5,937,275 titled 'Method of producing acceleration sensors' (2.10.1. Robert Bosch GmbH).

Referring to FIG. 10, this U.S. Pat. No. 5,937,275 claims in its claim 1: A method for producing sensors, especially acceleration sensors in which on a substrate (1) with a sacrificial layer (2), in an epitaxial application system, a silicon layer (4) is deposited that is deposited above the sacrificial layer (2) as a polysilicon layer (6), a first photoresist layer (not illustrated) being applied to the polysilicon layer (6) and being structured by optical methods as an etching mask, and structures (not illustrated) being introduced into the polysilicon layer (6) through the etching mask, which structures extend from the top side of the polysilicon layer (6) as far as the sacrificial layer (2), a sacrificial layer (2) being removed from beneath the structures (not illustrated), characterized in that the surface of the polysilicon layer (6) is post-machined in a smoothing process before the first photoresist layer (not illustrated) is applied. Amongst other things, the other claims cover: the use of a photoresist plasma etch-back planarization process for the polysilicon layer, a chemical-mechanical polishing process of the polysilicon layer, a polysilicon starter layer under the polysilicon layer, a polysilicon layer over the sacrificial layer simultaneously to an epitaxial growth over the regions where no sacrificial layer is provided.

This first patent does not yet describe the protective cavity that Robert Bosch GmbH uses around the moving and/or particular component of the MEMS device.

FIG. 11 shows an example of the surface micromachining performed at Robert Bosch GmbH, as reported on the Europractice web site:

http://www.europractice.bosch.com/en/download/customer_support.pdf

This FIG. 11 shows that a 380 $\mu$m thick Cap wafer is used as to form a 75 $\mu$m high protective cavity over the 10.3 $\mu$m thick released polysilicon structures.

Some details of this surface micromachining process are also available in the following cited Prior Art reference:

M. Furtsch, M. Offenberg, H. Muenzel, J. R. Morante, 'Comprehensive study of processing parameters influencing the stress and stress gradient of thick polysilicon layers', SPIE Conference Proceedings 'Micromachining and microfabrication process technology III, conference proceedings', SPIE Vol. 3223, pp. 130–141, Austin Tex., Sep. 29–30,1997.

This Furtsch's Prior Art reference indicates that:

The starting material is a 150 mm (100) N-type 1–2 ohm cm resistivity silicon wafer;

The 2.5 μm thick Pad oxide is thermally grown on the substrate;

The 0.45 μm thick Surface polysilicon layer is deposited using a standard 630° C. Low Pressure Chemical Vapor Deposition (LPCVD) process;

The 0.45 μm thick Surface polysilicon layer is implanted with antimony and annealed at 1000° C. in an oxygen ambient as to drive and activate the Sb dopant;

There is no indication on the fabrication technique of the 1–6 μm thick Sacrificial oxide;

The 10.3 μm thick Structural ISDP (In-Situ Doped Polysilicon) layer is deposited as a 11.8 μm thick layer at a rate of 3.5 μm/minute and at a temperature of 1180° C. in a ASM Epsilon One Model-E2 single wafer epitaxy reactor using a standard trichlorosilane (SiHCl3), hydrogen (H2), and phosphine (PH3) process. The resulting 11.8 μm thick Structural ISDP layer has an average surface roughness (Ra) of 260 nm, which is unacceptable for further processing. A chemical mechanical polishing (CMP) is then used to reduce the thickness of the Structural ISDP to 10.3 μm and its surface roughness to about 5 μm. The silicon single crystals growing epitaxially over the silicon substrate regions opened through the 2.5 μm thick Pad oxide windows have a sheet resistance of 2 k/sq. The as-grown polycrystalline structure being higher then 100 M/sq., a 900° C. POC13 doping is also performed, resulting in the growth of a 30 nm thick phosphorous glass (PSG) on top of the Structural ISDP. This thin grown PSG layer is removed using a standard HF etching solution. A protective oxide is grown at 900° C. to prevent the out-diffusion of phosphorus during the following 7 hours duration 1000° C. P-dopant drive-in in a nitrogen ambient. The protective oxide is then removed.

The Deep silicon etch patterns are generated using the technique described in the following Prior Art work:

M. Offenberg, F. Larmer, B, Elsner, H. Munrel and W. Rietlumuller, 'Novel process for a monolithic integrated accelerometer', Digest of technical papers: Transducers '95—Eurosensors IX, Vol. 1, pp. 589–592, Stockholm, 1995.

The release of the Structural ISDP components is done using a HF vapor technique described in the following Prior Art work as to avoid sticking of the structures:

M. Offenberg, B, Elsner and P. Larmer, 'HF vapor etching for sacrificial oxide removal in surface micromachining', Extended Abstracts Electrochem. Soc. Fall Meeting, Vol. 942, pp. 1056–1057, Miami Beach, 1994.

There are no further details about the 1.3 μm thick Metal layer, about the 380 μm thick Cap wafer nor about the 75 μm Cavity.

Some details of this surface micromachining process are also available in the following cited Prior Art reference:

http://wvw.imec.be/SUMICAP/Welcome.html#who

Bosch currently uses glass frit to bond the Cap wafer to the substrate as to provide an hermetic seal. FIG. 12 shows an example of a Cap wafer glass frit bonded to the surface micromachined gyroscope produced at Robert Bosch GmbH.

The SUMICAP (SUrface MIcromachined enCAPsulation on wafer-level) project carried out by IMEC, Bosch and STS within the framework of the Information Societies Technology (IST) program of the European Commission (contract number IST-1999-10620) between January 2000 and December 2002 intends to develop a wafer-level encapsulation technique for MEMS using surface micromachined membranes over the device that needs to be encapsulated in a vacuum (below 100 Pa) or controlled atmosphere. This monolithic wafer-level packaging technique:

Should be capable of covering 1 mm by 1 mm MEMS devices having high aspect ratio trenches (1:5);

Should survive standard plastic molding;

Should use less chip area and material than the current capping process;

Should provide a 50% reduction of the total chip cost;

Should allow a vacuum in the cavity below 100 Pa.

The project managed by IMEC involves the following technology steps: Sacrificial oxide layer deposition, Membrane layer deposition, Sacrificial oxide etching using the standard STS equipment, Sealing layer deposition and Interconnections. The expected result is a wafer-level surface micromachined encapsulation in a plastic molding of an accelerometer demonstrator optimized using Bosch's extensive simulations to decide on the required thickness and stress of membrane and sealing layer, the number of supports and the optimal sensor design.

The review of the cited Prior Art indicates that there is a need to improve the packaging techniques of MEMS devices as to ensure higher yields, higher performance and improved reliability.

Most of the cited Prior Art works describe the need for bonding multiple substrates as to get the required protective cavity around the moving and/or particular component of the MEMS device:

U.S. Pat. No. 5,668,033 titled 'Method for manufacturing a semiconductor acceleration sensor device' (FIG. 2).

U.S. Pat. No. 5,783,749 titled 'Vibrating disk type microgyroscope' (FIG. 3).

U.S. Pat. No. 5,952,572 titled 'Angular rate sensor and acceleration sensor' (FIG. 4).

U.S. Pat. No. 6,140,144 titled 'Method for packaging microsensors' (FIG. 5).

U.S. Pat. No. 6,232,150 titled 'Process for making microstructures and microstructures made thereby' (FIG. 6).

U.S. Pat. No. 6,265,246 titled 'Microcap wafer-level package' (FIG. 7).

U.S. Pat. No. 6,297,072 titled 'Formation of a microstructure having an internal cavity' (FIG. 8).

http://www.europractice.bosch.com/en/download/customer_support.pdf (FIG. 11).

M. Furtsch, M. Offenberg, H. Muenzel, J. R. Morante, 'Comprehensive study of processing parameters influencing the stress and stress gradient of thick polysilicon layers', SPIE Conference Proceedings 'Micromachining and microfabrication process technology III, conference proceedings', SPIE Vol. 3223, pp. 130–141, Austin Tex., Sep. 29–30, 1997 (FIG. 11).

The currently available technique of bonding multiple substrates as to get the protective cavities causes the previously mentioned cost, yield, performance and reliability limitations.

The following reference:

http://www.sensorsmag.com/articles/1298/sil1298/main.shtml was used to generate the following summary table of the main bonding options for these multiple substrates, which are: Anodic bonding, glass frit bonding and direct wafer bonding.

| Bonding Technique | Required Bonding Temp. (° C.) | Required Applied Pressure (Pa) | Required Applied Voltage (V) | Required Surface Roughness (nm) | Required Precise Gaps | Capable of Hermetic Sealing | Achievable Vacuum Level (Pa) |
| --- | --- | --- | --- | --- | --- | --- | --- |
| Anodic | 300–500 | N/A | 100–1000 | 20 | Yes | Yes | 0.001 |
| Glass Frit | 400–500 | 100,000 | N/A | N/A | No | Yes | 1300 |
| DWB | 1000 | N/A | N/A | 0.5 | Yes | Yes | 0.1 |

It is clear from the upper table that the direct wafer bonding (DWB) technique is not suitable because the bonding of the protective cavity is performed after the metallisation step and the required 1000° C. is simply incompatible with it.

It is also clear that the glass frit bonding is also unsatisfactory for most applications because the poor 1300 Pa achievable vacuum way higher then the expected 1 Pa vacuum level degrades the Q-factor of most micro-gyros, of most micro-accelerometers, of most differential resonant accelerometers and of many other MEMS-based devices requiring better then 1 Pa vacuum.

The anodic bonding technique is then the most appropriate one. It relies on charge migration in order to bond the silicon wafer to a glass cover containing a high content of alkali metals, such as Pyrex borosilicate glass which contains about 3.5% of sodium oxide (Na2O). The positive ions (Na+) of the glass are attracted by a highly negative potential applied to the glass, where they are neutralized. Such a Na+ ions removal permits the formation of a space charge at the glass-silicon interface, which creates a strong electrostatic attraction between the silicon wafer and the glass cover that holds both pieces firmly in place. The bond is performed at temperatures of up to 500° C., which increases the mobility of the positive ions (Na+). Furthermore, driven by the existing electric field, oxygen from the glass is transported to the glass-silicon interface where it combines with silicon to form SiO2, which creates a permanent bond. This technique has been reported as producing uniform bonds; however, the presence of charge carriers makes this bond generally not compatible with active devices.

With an increased demand for lower cost CMOS integrated MEMS devices in cost-sensitive markets such as automotive, there is a clear need to avoid the use of anodic bonding or other multiple substrates bonding techniques; a low cost, simple, CMOS compatible cavity formation technique is required.

With an increased sophistication of the MEMS devices, from simple industrial pressure sensors to more complex automotive/aerospace micro-gyroscopes or photonics' micro-mirrors, there is a serious need for higher yields and higher performance packaging capable of ensuring a 1 Pa vacuum in the surrounding of the moving and/or particular component of these higher performance and improved reliability.

The described IMEC-Bosch-STS SUMICAP project on-going within the IST program of the European Commission until December 2002 and intended to develop a wafer-level encapsulation technique for MEMS is a clear indication of the major technological need for the packaging of large size (more then 1 mm) MEMS devices in standard plastic molding using surface micromachined membranes over MEMS devices that need to be encapsulated to below 100 Pa at a 50% reduced total chip cost.

The Sacrificial oxide layer deposition by Bosch, the Membrane layer deposition by Bosch, the Sacrificial oxide etching by STS equipment, the Sealing layer deposition by Bosch and the Interconnections by Bosch will probably soon result in the demonstration of the 100 Pa vacuum-sealed wafer-level surface micromachined encapsulation in a plastic molding of an accelerometer demonstrator optimized using Bosch's extensive simulations. This 100 Pa performance goal will still be restrictive for the high performance (high Q-factor) micro-gyros, micro-accelerometers, differential resonant accelerormeters and other MEMS-based devices requiring a residual vacuum level better then 1 Pa.

SUMMARY OF THE INVENTION

In accordance with a first aspect of the present invention there is provided a process for fabricating an integrated, wafer-level protective cap on a micro-electronic device comprising: depositing first and second layers of sacrificial material during a fabrication stage of the device, the first and second layers of sacrificial material being selectively patterned; depositing and patterning an encapsulation structure over the second layer of sacrificial material; removing the patterned sacrificial material through the encapsulation structure by a vapor etch to form the micro-electronic device; and depositing a sealing layer over the encapsulation structure.

In accordance with a second aspect of the present invention there is provided a process for fabricating an integrated wafer-level protective cap for a micro-Electro-Mechanical-System (MEMS) device comprising: depositing and patterning a pad oxide layer on a silicon substrate; depositing and patterning a polysilicon layer on the pad oxide layer and silicon substrates; depositing and patterning a first layer of a sacrificial material; depositing and patterning structured In-Situ-Doped-Polysilicon (ISDP) on the first layer of sacrificial materials; patterning and deep etching the ISDP; depositing and patterning a second layer of sacrificial material; depositing an encapsulation structure over patterned second layer of sacrificial material; patterning the encapsulation structure; selectively removing the first and second layers of sacrificial material to create the MEMS; and depositing, under vacuum, a sealing layer over the encapsulated structure.

There is also provided an MEMS fabricated in accordance with the above methods.

The present application provides a competitive, simple, single-substrate, wafer-level packaging technique capable of creating the vacuum-sealed protective cavity around the moving and/or particular component of these higher performance and improved long-term reliability MEMS device. This simple technique uses common semiconductor materials, techniques and equipment to provide a stable vacuum environment of less then 1 Pa in the sealed cavity. This environment protects the moving and/or particular component of the MEMS device against micro-contamination from the particles and slurry of the wafer dicing process, against fluctuations of the atmospheric conditions such as atmospheric pressure and relative humidity as to ensure a long-term reliability by keeping the moving and/or particular component.

BRIEF DESCRIPTION OF THE DRAWINGS

The invention will now be described in greater detail with reference to the attached drawings wherein:

FIG. 1 illustrates packaging of a micro-mechanical resonator according to the prior art;

FIG. 2 illustrates packaging of an acceleration sensor device of the prior art;

FIG. 3 illustrates vacuum packaging of a micro-gyroscope of tile prior art;

FIG. 4 illustrates an angular rate sensor using anodic bonding of the prior art;

FIG. 7 illustrates packaging of a micro-device using cold welding according to the prior art;

FIG. 8 illustrates formation of a microstructure having an internal cavity according to the prior art;

FIG. 9 illustrates protection of a released MEMS element during packaging according to the prior art;

DETAILED DESCRIPTION OF THE INVENTION

Figure 13:
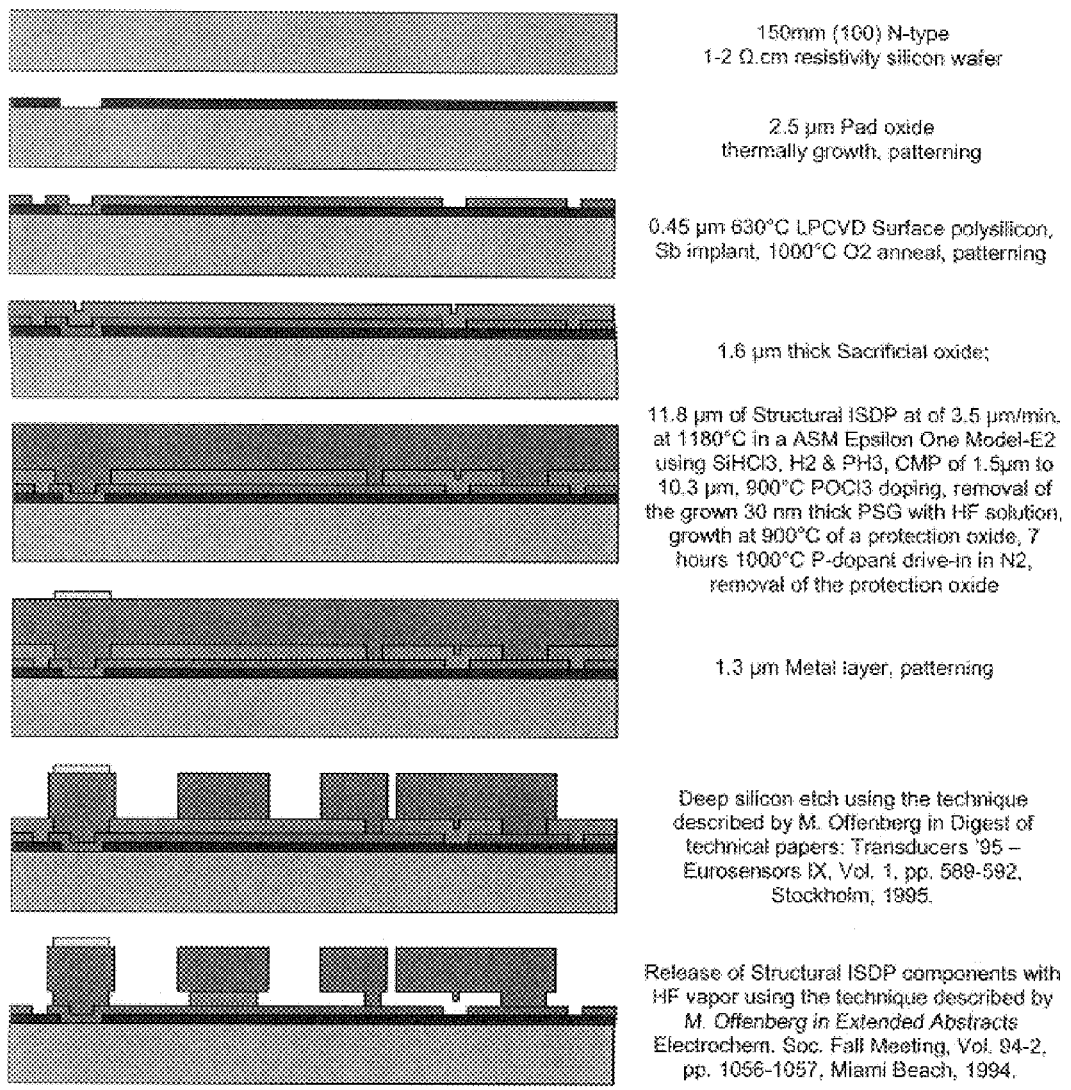
FIG. 13 illustrates a typical surface micromachining process flow.

FIG. 13 shows a typical surface micromachining process such as the one performed at Robert Bosch GmbH, as described in the following cited Prior Art references:

M. Offenberg, B, Elsner and F. Larmer, 'HF vapor etching for sacrificial oxide removal in surface micromachining', Extended Abstracts Electrochem. Soc. Fall Meeting, Vol. 94–2, pp. 1056–1057, Miami Beach, 1994;

M. Offenberg, F. Larmer, B, Elsner, H. Munzel and W. Riethmuller, Novel process for a monolithic integrated accelerometer', Digest of technical papers: Transducers '95—Eurosensors IX, Vol. 1, pp. 589–592, Stockholm, 1995;

M. Furtsch, M. Offenberg, H. Muenzel, J. R. Morante, 'Comprehensive study of processing parameters influencing the stress and stress gradient of thick polysilicon layers', SPIE Conference Proceedings 'Micromachining and microfabrication process technology III, conference proceedings', SPIE Vol. 3223, pp. 130–141, Austin, Tex., Sep. 29–30, 1997.

Figure 5:
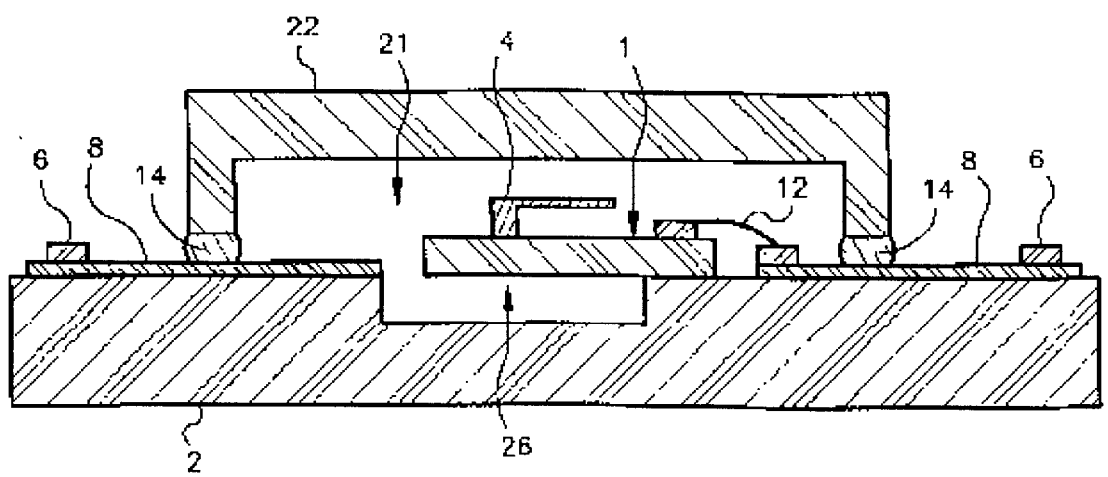
FIG. 5 illustrates packaging of a micro-sensor via flip chip bonding of the prior art.
Figure 6:
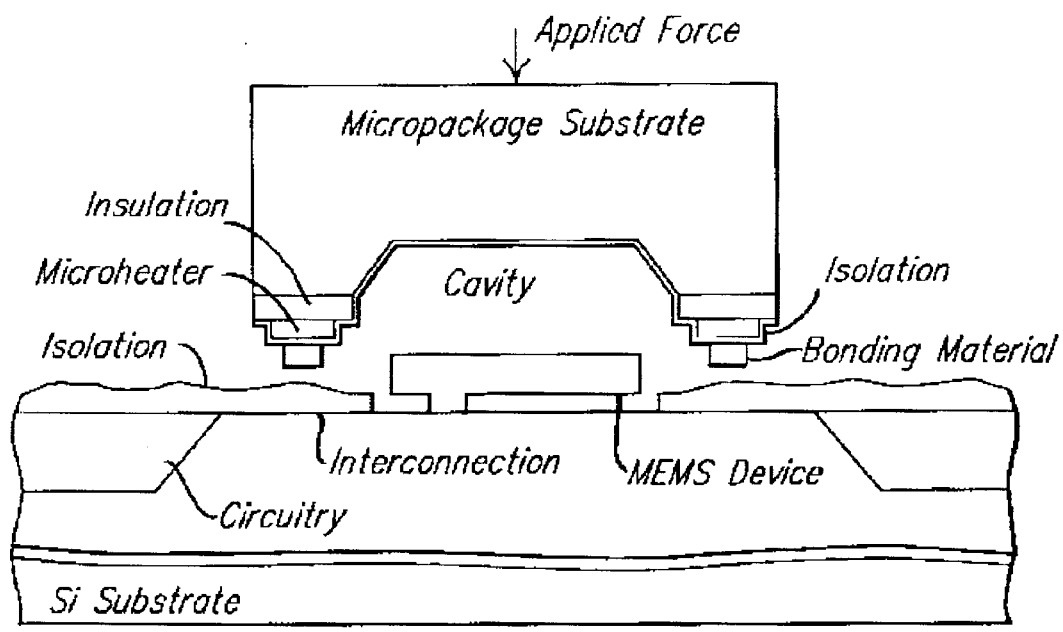
FIG. 6 illustrates packaging of a microstructure via flip chip bonding according to the prior art.
Figure 10:
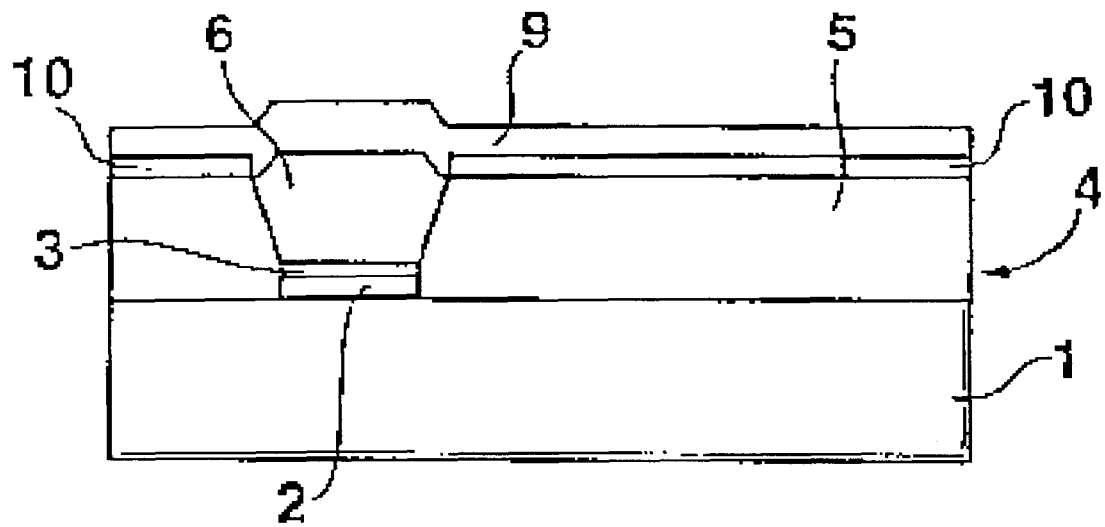
FIG. 10 illustrates a method of producing acceleration sensors according to the prior art.
Figure 11:
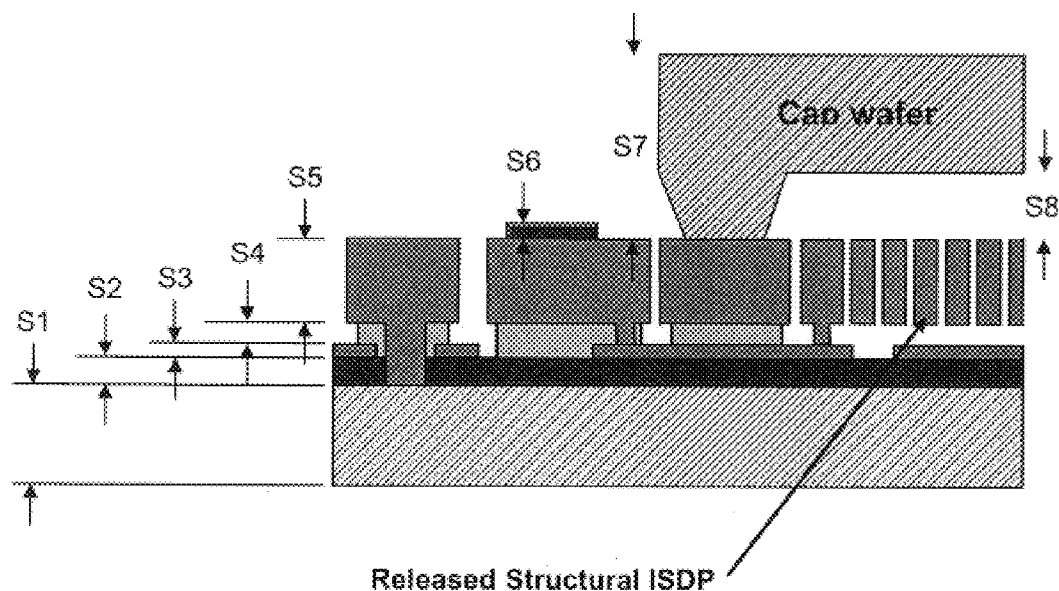
FIG. 11 illustrates a surface micromachining profile according to the prior art.
Figure 12:
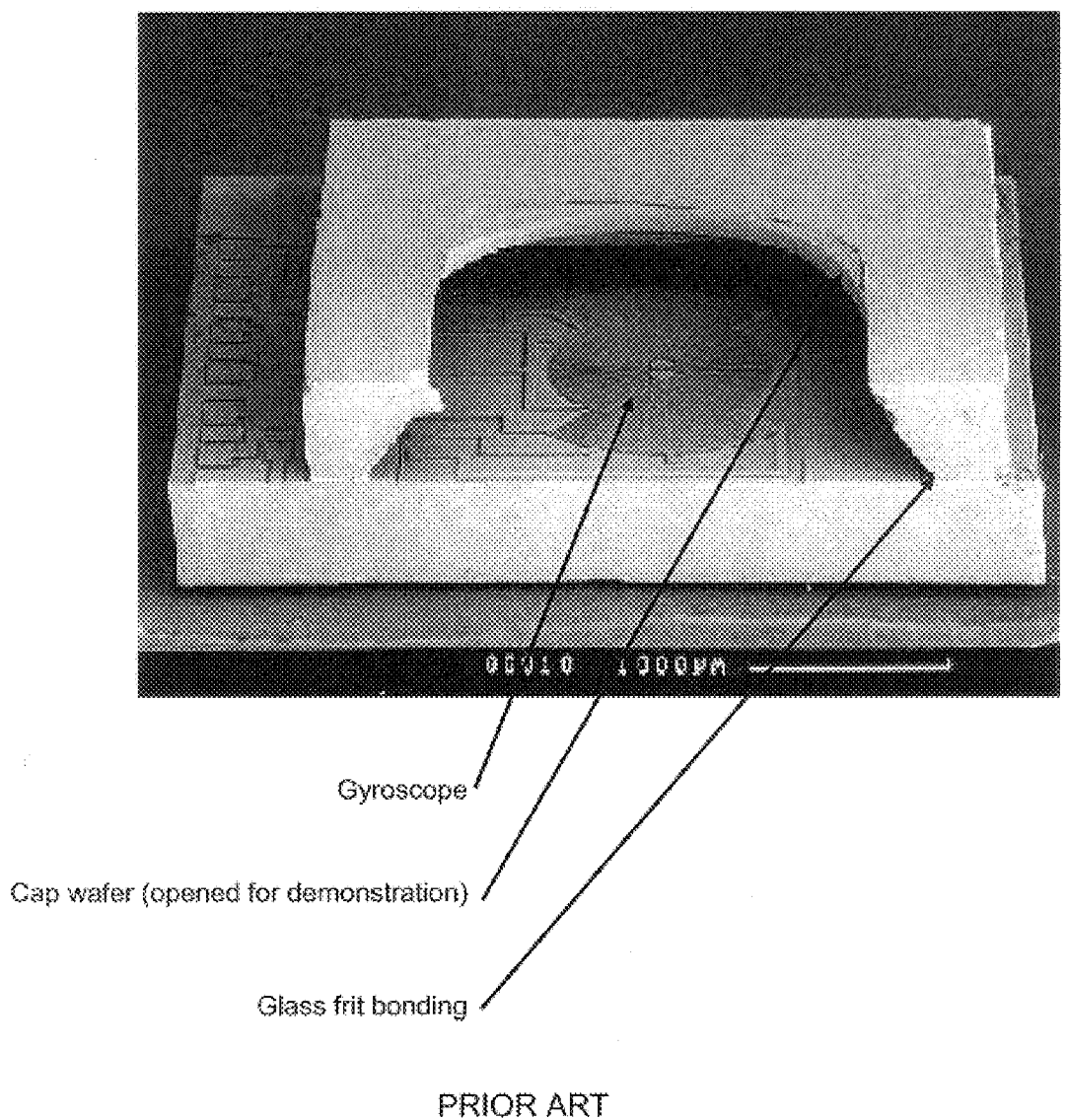
FIG. 12 illustrates a cap wafer glass frit bonded to the surface of a micromachined gyroscope according to the prior art.

The process described at FIG. 13 shows the main steps involved in the release of the Structural ISDP forming the moving components of the MEMS-based micro-sensors or micro-actuators:

Selection of 150mm (100) N-type 1–2 ohm cm resistivity silicon wafer;

Thermal growth of 2.5 $\mu$m of Pad oxide, followed by patterning;

630° C. LPCVD of 0.45 $\mu$m of Surface polysilicon, followed by an antimony implant, by a 1000° C. O2 anneal, and by patterning;

Deposition of 1.6 $\mu$m of Sacrificial oxide;

Deposition of 11.8 $\mu$m of Structural ISDP at a rate of 3.5 $\mu$m/minute and at a temperature of 1180° C. in a ASM Epsilon One Model-E2 using SiHCl3, H2 & PH3 gases, followed by a CMP of 1.5 $\mu$m to reduce the thickness of the Structural ISDP to 10.3 $\mu$m, followed by a 900° C. POC13 doping, followed by the removal of the grown 30 $\mu$m thick PSG with HF solution, followed by the growth, at 900° C., of a protection oxide, followed by a 7 hours duration P-dopant drive-in in N2 at a temperature of 1000° C. and, finally, followed by the removal of the protection oxide;

Deposition and patterning of a 1.3 $\mu$m metal layer;

Deep silicon etch of the Structural ISDP using the technique described in the following reference:

M. Offenberg, F. Larmer, E, Elsner, H. Munzel and W. Rietlumuller, 'Novel process for a monolithic integrated accelerometer', Digest of technical papers: Transducers '95—Eurosensors IX, Vol. 1, pp. 589–592, Stockholm, 1995;

Release of Structural ISDP components with HE vapor using the technique described in the following reference:

M. Offenberg, B, Elsner and F. Larmer, 'HF vapor etching for sacrificial oxide removal in surface micromachining', Extended Abstracts Electrochem. Soc. Fall Meeting, Vol. 94–2, pp. 1056–1057, Miami Beach, 1994;

The resulting is a released MEMS ready to be bonded to its protective Cap wafer, as shown in FIG. 12. As mentioned, Robert Bosch GmbH currently uses glass frit to bond the Cap wafer to the substrate as to provide an hermetic seal. It is clear from the previous table that the resulting vacuum level is not adequate, since limited to about 1300 Pa.

Figure 14:
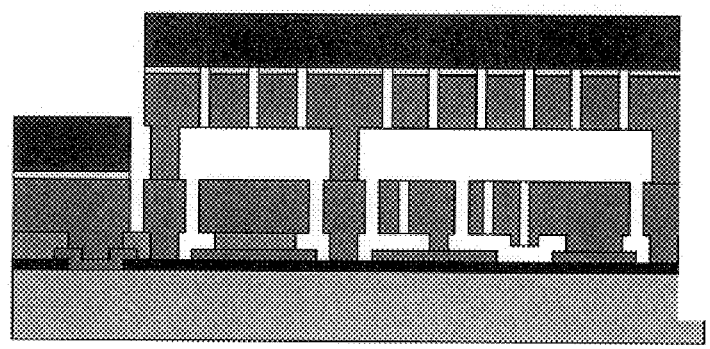
FIG. 14 *a*) to 14 *t*) illustrate the integrated process steps of the present invention and FIG. 15 illustrates amplitude of the vertical movement of the encapsulation structure estimation using the Bulge testing mode.

The improved surface micromachining process resulting in the fabrication of an integrated wafer-level protective cap of the invention is shown in the series of sketches a) to t) of FIG. 14. Some of the first steps are exact copies of the cited Prior Art information.

Step a) Shows the Silicon substrate;

Step b) Shows the Pad oxide growth to a thickness of about between 0.5—5.0 $\mu$m and preferably 2.5 $\mu$m;

Step c) Shows the Pad oxide patterning as to allow some contacts to be done with the substrate;

Step d) Shows the Surface polysilicon deposition to a thickness between 0.25–1.0 $\mu$m and preferably 0.45 $\mu$m, also by LPCVD at a temperature between 610–650° C. and preferably 650° C. and followed by an antimony implant and by a high temperature anneal at a temperature between 950–150° C. and preferably 1050° C. in a nitrogen, oxygen or combinations of oxygen and nitrogen ambients;

Step e) Shows the Surface polysilicon patterning using standard photolithography techniques;

Step f) Shows the deposition of the Lower sacrificial material. This material must have a very low etch rate when exposed to HF vapor. The following cited Prior Art reference is used to generate the following etch rates achieved in a commercial Gemetec reactor operating at 35° C.:

A. Witvrouw, B. Du Bois, P. De Moor, A. Verbist, C. Van Hoof, H. Bender, K. Baert, 'A comparison between wet HF etching and vapor HF etching for sacrificial oxide removal', Proceedings of SPIE, Micromachining and microfabrication process technology VI, SPIE Vol. 4174, pp. 131–141, Santa Clara, USA, Sep. 18–20 2000;

| Material | Annealed PSG | TEOS | Annealed TEOS | Thermal Oxide | Titanium | Titanium Nitride | Al—Cu Alloys |
|---|---|---|---|---|---|---|---|
| Etch rate @ 35° C. (nm/min) | 290 ± 20 | 220 ± 40 | 100 ± 10 | 15 ± 1 | 0.19 ± 0.02 | 0.06 ± 0.02 | 0.03 |
| Relative etch rate @ 35° C. | 19 | 15 | 6.7 | 1 | 0.01 | 0.004 | 0.002 |

Step f) This upper table suggests that an annealed TEOS layer (with or without a very thin etch-stop layer of TiN deposited on its surface) appears to be a good candidate for the Lower sacrificial material. The various candidates for the Lower sacrificial material includes annealed TEOS, annealed PSG, annealed SiO2, titanium nitride, or combinations of these.

Figure 15:
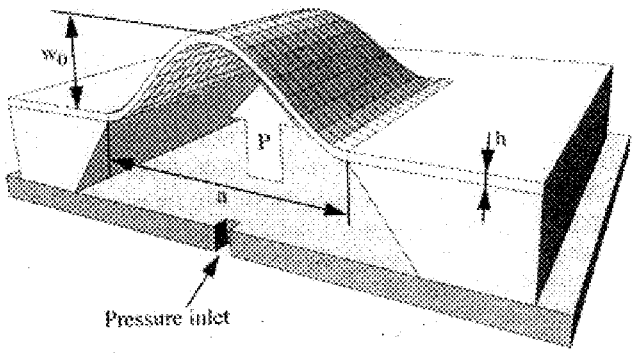

Step g) Shows the patterning of the Lower sacrificial material using standard photolithography techniques;

Step h) Shows the Structural ISDP deposition from silane, dichlorosilane, SiH2Cl2, or trichlorosilane, SiHCl3, preferably from trichlorosilane, using an in-situ source of doping during deposition, preferably phosphine, PH3, using a carrier gas, such as hydrogen, and a post-deposition processing which may involve an additional doping using POCl3 doping, N-type spin-on doping and/or N-type implantation in order to achieve a Structural ISDP having the following characteristics:

Mechanical stress lower then 30 MPa, and preferably lower then 10 MPa;

Stress gradient lower then 3 MPa/$\mu$m and preferably lower then 1 MPa/$\mu$m;

Sheet resistivity onto openings to underlying single crystal substrate between 0.5–5.0 k ohms/sq, preferably 2.0 k ohms/sq;

Sheet resistivity onto Lower sacrificial oxide regions openings between 0.5–50.0 k ohms/sq, preferably lower then 20.0 k ohms/sq;

Step i) Shows the deposition of a 0.05–0.50 $\mu$m thick, preferably 0.1 $\mu$m of a film characterized by a very slow etch rate when exposed to HF vapor, preferably titanium nitride, TiN, deposited by reactive sputtering followed by its patterning using standard photolithography techniques as to leave the HF vapor resistant film outside the projected location of the protection cavity;

Step j) Shows the photolithography and deep-etch of the Structural ISDP using a deep vertical silicon etcher such as the STS Multiplex ICP240;

Step k) Shows the deposition of an Upper sacrificial material having a very high etch rate when exposed to HF vapor, at least four times the rate of the selected Lower sacrificial material. The Upper sacrificial material should have a low mechanical stress as to avoid disrupting the deep etched Structural ISDP structures still bonded to the Lower sacrificial material and should have an excellent conformal coating as to fill the closely packed etched patterns (a typical minimum spacing is about 2.5 $\mu$m) and structures to avoid excessive localized undercuts (larger then about 10 $\mu$m) of the underlying Structural ISDP structures following their over-etch with HF vapor. The low deposition temperature (lower then 500° C.) deposition technique could be Atmospheric Pressure Chemical Vapor deposition, APCVD, Low Pressure Chemical Vapor Deposition, LPCVD, Electron Cyclotron Resonance deposition, ECRD, Metal-Organic Chemical Vapor Deposition, MOCVD, but preferably PECVD. The material itself could be a silica glass, SiO2, a phosphosilicate, PSG, another silicate glass, such as the ones obtained from boron, titanium or germanium incorporation, but is preferably a Tetra-Ethyl-Ortho-Silicate glass, TEOS, because of its superior conformal deposition in deep and narrow situations. Independently of the selected deposition technique, deposited material, the deposition conditions will be adjusted as to obtain hydrogen-rich lower density materials or other compositions and densities which are prone to a faster etch rate when exposed to HF Vapor;

Step l) Shows the patterning of the Upper sacrificial material as to create a series of pillars and localized structures to be filled with the Encapsulation structure to enhance the mechanical rigidity and prevent the collapse of the Encapsulation structure when exposed to atmospheric pressure. A thin hard mask, such as aluminum or other materials having good etch resistance at that step, may be used to improve the performance of this deep lithography. This thin layer is not sketched in the FIG. 14, step l). The position of the pillars and localized mechanical structures is such that they reach the top of electrically isolated Structural ISDP structures, as to prevent electrically shorting the circuitry with the conductive Encapsulation structure. The presence of these localized structures also allows to maintain everywhere of a maximum spacing of about 5.0 $\mu$m, a value sufficiently low to ensure complete filling of all etched patterns of the Suspended Epipoly with the Upper sacrificial material. The patterning of the Upper sacrificial material also defines the outer limits of the cavity under construction;

Step m) Shows the deposition of the Encapsulation structure. The thickness of this layer is of the order to 10 $\mu$m and its thickness will be optimized by optimizing its constituent material. The preferred materials include: titanium, Ti, titanium nitride, TiN, polysilicon, poly-Si, silicon nitride, SiN, tungsten, W, titanium tungsten alloy, Ti—W, or combinations of these. Other materials could also be used. In general, the material or combination of materials composing this Encapsulation structure must have a very high Young's Modulus, in excess of 100 Gpa, as to prevent excessive deformation following the atmospheric pressure of the underlying sealed cavity, must have a very high resistance to HF vapor, as to allow the removal of the Upper sacrificial material and of the Lower sacrificial material without any substantial widening of small diameter etch pipes to be machined in the Encapsulation structure, must be deposited at an as low temperature as possible, as to limit as much as possible the densification of Upper sacrificial material thus ensuring a much faster etch rate in HF vapor. The material or combination of materials composing this Encapsulation structure must also have an excellent conformal deposition as to generate the vertical pillars and localized vertical structures required to enhance the mechanical stability of the Encapsulation structure and prevent its collapse during exposure to atmospheric pressure of the vacuum sealed cavity. Young's Modulus, Poisson's coefficient and the amplitude of the vertical movement of the Encapsulation structure can all be estimated using the Bulge testing model of FIG. 15. Bulge tests are reported in the following reference to frequently be performed on 1.0 $\mu$m thick structures having lateral dimensions of the order of 1 mm, which is about the size of the sensitive portion of most MEMS devices of interest:

V. Ziebart, 'Mechanical Properties of CMOS thin films', A thesis submitted to the Swiss Federal Institute of Technology, Zurich, Published by: Physical Electronics Laboratory, Swiss Federal Institute of Technology (ETH) Zurich, 1999, 144 pages, ISBN 3-89649-519-4;

Step n) Shows the patterning of the Encapsulation structure as to produce a matrix of small diameter (of the order of 1.0 $\mu$m) deep (of the order of 10 $\mu$m) etch pipes which will later allow the very rapid removal of the Upper sacrificial material and the slower removal of the Lower sacrificial material using HV vapor, thus forming released MEMS components inside an enclosed cavity, ready to be sealed. These etch pipes need to be small enough to easily be closed by the surface tension of a high temperature aluminum alloy later to be deposited. The complete removal of the Encapsulation structure outside the cavity, over the TiN layer, is performed simultaneously to the patterning of these etch pipes.

Step o) Shows the removal of the Upper sacrificial material located in the upper cavity as well as outside the cavity, over the TiN and of the Lower sacrificial material using HF vapor. The HF vapor technique minimizes stiction problems and surface tension problems related to the use of liquid HF/water solutions following the release of the structures. The selection of an Upper sacrificial layer having a high HF etch rate over the Structural ISDP (preferably PECVD TEOS) with a Lower sacrificial layer having a low HF etch rate over the Surface polysilicon makes the control of the Structural ISDP undercut more easy and avoid undesirable release of the components which should not be released. At this process stage the MEMS structures are free to move since released from their surrounding material. The observation of the TiN area outside the cavity helps defining the moment the HF Vapor completes the etch inside the opaque cavity. An over-etch is required as to make sure that all of the Lower sacrificial material underneath the Structural ISDP structures to be released (the Structural ISDP structures narrower then about 6 $\mu$m) is effectively removed. This over-etch has to be minimized as to prevent the undercut to exceed about 12 $\mu$m.

Step p) Shows the optional deposition of a titanium based layer such as metallic titanium, Ti, titanium nitride compound, TiN, titanium-tungsten Ti—W alloy or a combination of these to be used as an in-situ getter of hydrogen, oxygen or water vapor. This optional layer will help enhancing the lifetime of the device by gettering these undesirable gases. Reactive sputter deposition using collimation enhances the transmission of titanium atoms through the high aspect-ratio (about 10:1) etch pipes micromachined in the Encapsulation structure. The light deposition of titanium on the upper surface of the Structural ISDP components enhances the gettering performance by enhancing the surface area available for capturing these undesirable gases. An optimum positioning of the micromachined etch pipes of the Encapsulation structure in relation with the underlying micromachined etch pipes of the underlying Structural ISDP will avoid the electrically conductive titanium-based material to coat the Surface polysilicon level where it could cause electrical leakage or worse, an electrical short:

Step q) Shows the deposition, under a vacuum better then 1 Pa, of a thick layer of an aluminum alloy followed by an in-situ high temperature self-diffusion provoking the bridging and vacuum sealing of the upper etch pipes of the Encapsulation structure. Again, the combination of the high aspect ratio upper etch pipes of the Encapsulation structure, coupled with their optimum positioning in relation with the lower etch pipes of the underlying Structural ISDP structure will prevent aluminum deposition on the Surface polysilicon where it could cause electrical leakage or worse, an electrical short. Following the self-diffusion of the thick layer of aluminum alloy, a upper thick layer of titanium, Ti, titanium nitride, TiN, or combinations of these, could be added as to enhance even more the rigidity of the Encapsulation structure. As to keep FIG. 14 simple, this extra upper layer of combination of layers is not included on sketches q) to t). Venting the vacuum-sealed metal coated wafer to atmospheric pressure will now impose a permanent mechanical stress onto this metal-coated Encapsulation structure. The information contained in FIG. 15 can be used to predict the mechanical deformation related to this exposure to atmospheric pressure for a given material and a given thickness;

Step r) Shows the patterning of the aluminum interconnects and bond pads outside the cavity, over the TiN layer. The patterned metal layer will be suitable for gold wire bonding;

Step s) Shows the removal of the TiN surrounding the aluminum interconnects and the bond pads outside the cavity;

Step t) Shows the completed device following the removal of the Structural ISDP surrounding the aluminum interconnects and bond pads outside the vacuum-sealed protection cavity.

The embodiments presented herein are exemplary only, and persons skilled in the art will appreciate that variations may be made without departing from the spirit of the invention. The scope of the invention is defined by the appended claims.

I claim:

1. A process for fabricating an integrated, wafer-level protective cap on a micro-electronic device comprising:

depositing first and second layers of sacrificial material during a fabrication stage of said device, said first and second layers of sacrificial material being selectively patterned;

depositing and patterning an encapsulation structure over said second layer of sacrificial material;

removing said patterned sacrificial material through the encapsulation structure by a vapor etch to form said micro-electronic device; and depositing a sealing layer over said encapsulation structure.

2. The method according to claim 1, wherein said first and second layers of sacrificial material have different etch rates.

3. The method according to claim 2, wherein said sealing layer is deposited under vacuum.

4. The method according to claim 3, wherein said vacuum is at least 1 Pa.

5. The method according to claim 1, wherein a titanium-based layer is deposited on said encapsulation structure to form an integrated getter for undesirable gases in said micro-electronic device.

6. The method according to claim 1, wherein said micro-electronic device is a Micro-Electro-Mechanical System (MEMS) device.

7. A process for fabricating an integrated wafer-level protective cap for a micro-Electro-Mechanical-System (MEMS) device comprising:

depositing and patterning a pad oxide layer on a silicon substrate;

depositing and patterning a polysilicon layer on said pad oxide layer and silicon substrates;

depositing and patterning a first layer of a sacrificial material;

depositing and patterning structured In-Situ-Doped-Polysilicon (ISDP) on said first layer of sacrificial materials;

patterning and deep etching said ISDP;

depositing and patterning a second layer of sacrificial material;

depositing an encapsulation structure over said patterned second layer of sacrificial material;

patterning said encapsulation structure;

selectively removing said first and second layers of sacrificial material to create said MEMS; and depositing, under vacuum, a sealing layer over said encapsulation structure.

8. The method according to claim 7, wherein said first and second layers of sacrificial material are removed by a vapor etch.

9. The method according to claim 8, wherein said first and second layers of sacrificial materials have different etch rates.

10. The method according to claim 9, wherein said sacrificial material is vapor etched using HF vapor.

11. The method according to claim 7, wherein said encapsulation structure has a high Young's Modulus.

12. The method according to claim 7, wherein said sealing layer is deposited under a vacuum of at least 1 Pa.

13. The method according to claim 7, wherein a titanium based layer is deposited on said encapsulation structure to act as an integrated getter of gases in said MEMS device.

14. The method according to claim 7, wherein an additional layer is deposited on said sealing layer to enhance rigidity of said sealing layer.

15. The method according to claim 7, wherein said sealing layer is an aluminum alloy which is subjected to an in-situ high temperature self-diffusion to bridge and seal etch pipes in said encapsulation layer.

16. The method according to claim 7, wherein extraneous material is removed to permit contacts to said MEMS.

17. The MEMS fabricated in accordance with the method of claim 16.

* * * * *